(12) United States Patent
Luquette et al.

(10) Patent No.: US 7,791,851 B1
(45) Date of Patent: *Sep. 7, 2010

(54) CASCODE COMBINATION OF LOW AND HIGH VOLTAGE TRANSISTORS FOR ELECTROSTATIC DISCHARGE CIRCUIT

(75) Inventors: Leo F. Luquette, Monument, CO (US); Marc D. Hartranft, Scotts Valley, CA (US); Scott Ward, Santa Clara, CA (US); Gina Liao, Santa Clara, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 344 days.

This patent is subject to a terminal disclaimer.

(21) Appl. No.: 11/339,016

(22) Filed: Jan. 24, 2006

(51) Int. Cl.
*H02H 3/20* (2006.01)
*H02H 9/04* (2006.01)

(52) U.S. Cl. .................. 361/56; 361/91.1; 361/111

(58) Field of Classification Search .................. 361/56, 361/91.1, 111
See application file for complete search history.

(56) References Cited

U.S. PATENT DOCUMENTS

| | | | |
|---|---|---|---|
| 5,321,293 A * | 6/1994 | Mojaradi et al. ............ 257/369 |
| 5,336,908 A | 8/1994 | Roberts | |
| 5,463,520 A | 10/1995 | Nelson | |
| 5,610,790 A | 3/1997 | Staab et al. | |
| 5,774,318 A * | 6/1998 | McClure et al. ............... 361/56 |
| 5,930,049 A | 7/1999 | Suenaga et al. | |
| 5,930,094 A * | 7/1999 | Amerasekera et al. ........ 361/56 |
| 6,072,218 A | 6/2000 | Chang et al. | |
| 6,078,487 A | 6/2000 | Partovi et al. | |
| 6,091,594 A | 7/2000 | Williamson et al. | |
| 6,147,538 A | 11/2000 | Andresen et al. | |
| 6,249,410 B1 * | 6/2001 | Ker et al. ...................... 361/56 |
| 6,310,379 B1 * | 10/2001 | Andresen et al. ............ 257/355 |
| 6,459,553 B1 * | 10/2002 | Drapkin et al. ............... 361/56 |
| 6,724,603 B2 | 4/2004 | Miller et al. | |
| 6,768,616 B2 | 7/2004 | Mergens et al. | |
| 7,027,276 B2 | 4/2006 | Chen | |
| 7,203,045 B2 | 4/2007 | Chatty et al. | |
| 7,345,894 B2 | 3/2008 | Sawtell et al. | |
| 7,385,793 B1 | 6/2008 | Ansel et al. | |
| 7,397,642 B2 | 7/2008 | Ker et al. | |
| 2004/0141270 A1 | 7/2004 | Kaneki | |
| 2004/0219760 A1 * | 11/2004 | Chaine et al. ............... 438/400 |
| 2006/0092590 A1 * | 5/2006 | Chuang et al. ............. 361/91.1 |
| 2007/0070659 A1 * | 3/2007 | Sawtell .................... 363/21.01 |
| 2007/0097581 A1 | 5/2007 | Khazhinsky et al. | |

OTHER PUBLICATIONS

C.A. Torres et al., "Modular, Portable, and Easily Simulated ESD Protection Networks for Advanced CMOS Technologies," pp. 82-95, EOS/ESD Symposium Proceedings, 2001.

2001 EOS/ESD Symposium, Table of Contents (2001) (citing Torres et al.), 20 pages.

(Continued)

*Primary Examiner*—Stephen W Jackson
*Assistant Examiner*—Tien Mai (57) ABSTRACT

A method and apparatus to provide electrostatic discharge (ESD) protection to electronic circuits using a combination of low voltage and high voltage transistors.

20 Claims, 8 Drawing Sheets

OTHER PUBLICATIONS

M. Stockinger et al., "Boosted and Distributed Rail Clamp Networks for ESD Protection in Advanced CMOS Technologies," pp. 17-26, EOS/ESD Symposium Proceedings, 2003.

2003 EOS/ESD Symposium Program Schedule, (Sep. 2003)(citing Stockinger et al.), 19 pages.

U.S. Appl. No. 11/339,053, Office Action mailed Apr. 19, 2007.

U.S. Appl. No. 11/339,053, Office Action mailed Oct. 9, 2007.

U.S. Appl. No. 11/339,053, Notice of Allowability mailed Feb. 11, 2008.

U.S. Appl. No. 11/339,053, Supplemental Notice of Allowability mailed Mar. 19, 2008.

U.S. Appl. No. 12/130,507, Office Action mailed Sep. 18, 2008.

USPTO Notice of Allowance for U.S. Appl. No. 11/339,053 dated Mar. 19, 2008; 5 pages.

USPTO Notice of Allowance for U.S. Appl. No. 11/339,053 dated Feb. 11, 2008; 3 pages.

USPTO Notice of Allowance for U.S. Appl. No. 11/339,053 dated Feb. 11, 2008; 4 pages.

USPTO Final Rejection for U.S. Appl. No. 11/339,053 dated Oct. 9, 2007; 8 pages.

USPTO Non-Final Rejection for U.S. Appl. No. 11/339,053 dated Apr. 19, 2007; 13 pages.

USPTO Notice of Allowance for U.S. Appl. No. 12/130,507 dated Feb. 4, 2009; 8 pages.

USPTO Non-Final Rejection for U.S. Appl. No. 12/130,507 dated Sep. 18, 2008; 10 pages.

USPTO Non-Final Rejection for U.S. Appl. No. 12/130,507 dated Mar. 24, 2010; 12 pages.

USPTO Advisory Action for U.S. Appl. No. 12/130,507 dated Feb. 23, 2010; 4 pages.

USPTO Final Rejection for U.S. Appl. No. 12/130,507 dated Dec. 1, 2009; 14 pages.

USPTO Non-Final Rejection for U.S. Appl. No. 12/130,507 dated Jul. 10, 2009; 10 pages.

* cited by examiner

FIG. 1

(PRIOR ART)

CASCODE COMBINATION OF LOW AND HIGH VOLTAGE TRANSISTORS FOR ELECTROSTATIC DISCHARGE CIRCUIT

TECHNICAL FIELD

This invention relates to the field of electrostatic discharge (ESD) circuits and, in particular, to ESD shunt circuits.

BACKGROUND

Electrostatic discharge (ESD), which is the rapid discharge of static electricity from one conductive material to another, can damage computer equipment. An electric charge transfers from one conductor to another because of a difference in electrical potential of the conductive bodies. As used herein, an ESD event is the occurrence of an electrostatic discharge.

ESD can negatively affect computer equipment in many ways. An ESD event during manufacturing can cause product defects. An ESD event during operation can cause a product to malfunction or incur temporary or permanent damage. To prevent or control ESD events during operation, conventional computer equipment often includes ESD circuitry to route discharged static electricity away from critical components (e.g. to a ground reference). In general, ESD circuitry may be implemented to protect integrated circuits and microchips. In a particular example, ESD circuitry may be used to protect a random access memory (RAM) device.

Figure 1:
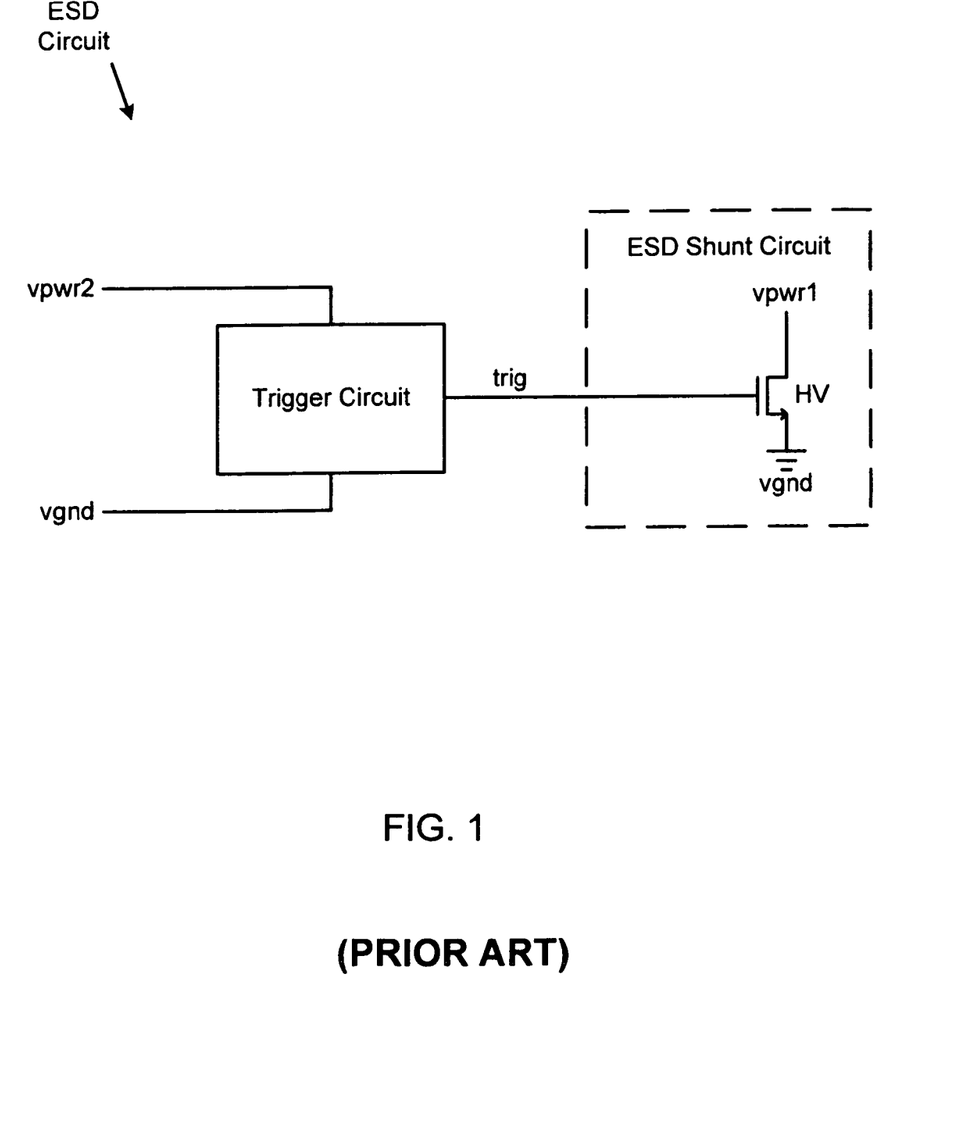
FIG. 1 depicts a conventional electrostatic discharge (ESD) circuit.

FIG. 1 depicts a conventional ESD circuit. The conventional ESD circuit includes a trigger circuit and an ESD shunt circuit. The trigger circuit controls the operation of the ESD shunt circuit. When the trigger circuit detects an ESD current on the power source, vpwr2, (which is also present on the power source, vpwr1), the trigger circuit sends a control signal, trig, to the ESD shunt circuit. The ESD shunt circuit includes a high voltage (HV) transistor. When the ESD shunt circuit is turned on by the trigger circuit, the ESD shunt circuit provides an electrical path between the power source, vpwr1, and the ground reference, vgnd, so that the ESD voltage and current are conducted to the ground reference. In this way, electrical components connected to the power source, vpwr1, are protected from damage due to the ESD event. The high voltage transistor is protected against damage during the ESD event because it has a relatively thick gate oxide layer. An exemplary thickness of a thick gate oxide layer of a high voltage transistor is approximately 60 Å ($60 \times 10^{-10}$ m).

During normal operation, before and after an ESD event, the control signal is driven low (e.g., to vgnd) so that the high voltage transistor is turned off. Turning off the high voltage transistor prevents unintended current flow from the voltage source to the ground reference during normal operation. In order for the low control signal to turn off the high voltage transistor, the high voltage transistor must have a positive threshold voltage. However, many modern technologies use native transistors that are not doped to raise the threshold voltage. In fact, some modern technologies use threshold voltages that are zero or slightly negative for cost savings in manufacturing. In addition to increasing the mask and manufacturing cost, the high voltage transistors yield lower drive current per unit width of the transistor compared to a low voltage transistor under the same bias conditions.

Currently, high voltage transistors with a positive threshold voltage are not used as frequently in many newly developed products and technologies. Additionally, new technologies often incorporate low voltage (LV) transistors in order to reduce power requirements or obtain other benefits. However, the use of low voltage transistors can present a challenge in designing ESD circuits because low voltage transistors do not sustain ESD voltages to the same degree as high voltage transistors. For example, a low voltage transistor may be designed for normal operation at approximately 1.8 volts, but a high voltage transistor may be designed for normal operation at greater than 1.8 volts. The relative operating voltages of low and high voltage transistors is related to the relative gate oxide thickness of low and high voltage transistors— transistors with thicker gate oxide layers can operate at high voltages. An exemplary thickness of a gate oxide layer of a low voltage transistor is approximately 20 Å ($20 \times 10^{-10}$ m).

Thus, where a single high voltage transistor is used to provide ESD protection in an ESD circuit, the ESD shunt circuit may be incompatible with a modern technology that uses low voltage (LV) transistors and/or lower threshold voltage transistors. Additionally, the protective functionality of the ESD shunt circuit is limited by the gate oxide stress voltage of the single high voltage transistor. Addition of a high voltage transistor with non-zero, positive threshold voltage to the process increases the mask and manufacturing cost. For high volume, low cost products this is not an economically viable solution.

BRIEF DESCRIPTION OF THE DRAWINGS

The present invention is illustrated by way of example, and not by way of limitation, in the figures of the accompanying drawings.

DETAILED DESCRIPTION

The following description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the spirit and scope of the present invention.

Embodiments of the present invention include various operations, which will be described below. These operations may be performed by hardware components, software, firmware, or a combination thereof. As used herein, the term "coupled to" may mean coupled directly or indirectly through one or more intervening components. Any of the signals provided over various buses described herein may be time multiplexed with other signals and provided over one or more common buses. Additionally, the interconnection between circuit components or blocks may be shown as buses or as single signal lines. Each of the buses may alternatively be one or more single signal lines and each of the single signal lines may alternatively be buses.

Certain embodiments may be implemented as a computer program product that may include instructions stored on a machine-readable medium. These instructions may be used to program a general-purpose or special-purpose processor to perform the described operations. A machine-readable medium includes any mechanism for storing or transmitting information in a form (e.g., software, processing application) readable by a machine (e.g., a computer). The machine-readable medium may include, but is not limited to, magnetic storage medium (e.g., floppy diskette); optical storage medium (e.g., CD-ROM); magneto-optical storage medium; read-only memory (ROM); random-access memory (RAM); erasable programmable memory (e.g., EPROM and EEPROM); flash memory; electrical, optical, acoustical, or other form of propagated signal (e.g., carrier waves, infrared signals, digital signals, etc.); or another type of medium suitable for storing electronic instructions.

Figure 2:
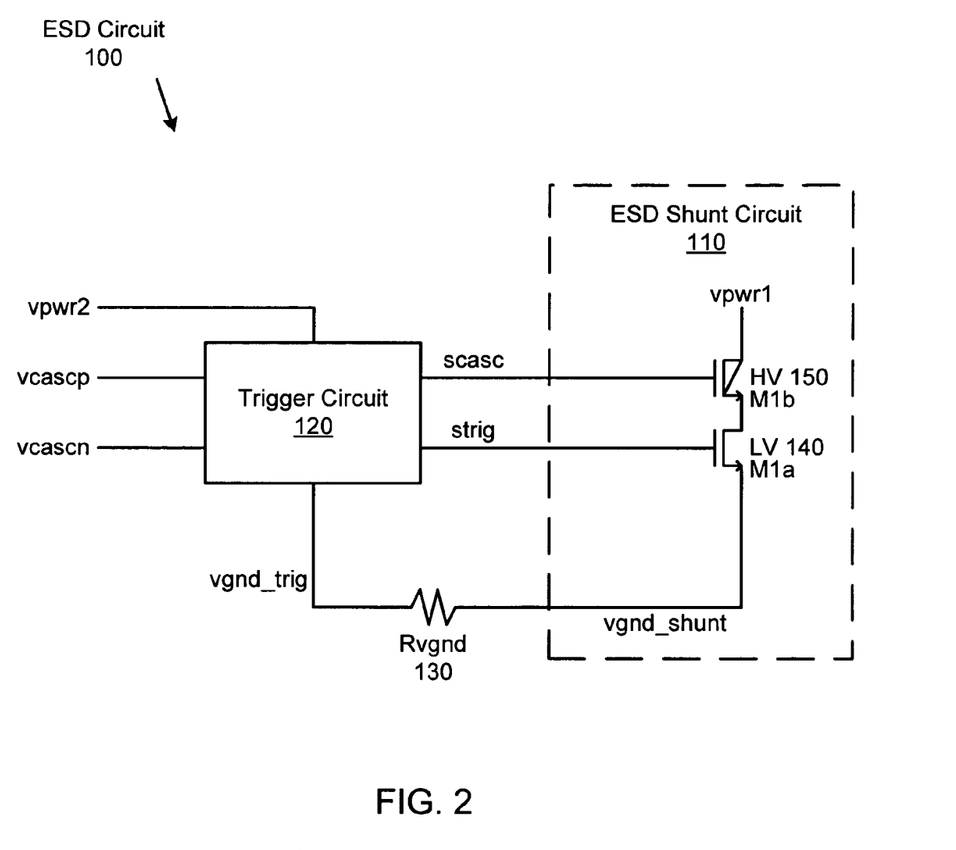
FIG. 2 depicts one embodiment of an ESD circuit having a modified ESD shunt circuit.

FIG. 2 depicts one embodiment of an ESD circuit 100 having a modified ESD shunt circuit 110. The illustrated ESD circuit 100 also includes a trigger circuit 120 and an implicit resistor 130. The resistive element 130 is designated as Rvgnd. Although the trigger circuit 120, ESD shunt circuit 110, and resistive load 130 are schematically shown connected to one another, the actual interconnections among the trigger circuit 120, the ESD shunt circuit 110, and the resistive load 130 may be routed in multiple manners, including indirect coupling via other components not shown in FIG. 2.

The trigger circuit 120 includes a power input, vpwr2, and two bias voltage inputs, vcascp and vcascn. The power input is tied to other electronic components (not shown) which are to be protected by the ESD circuit 100. The trigger circuit 120 detects an ESD current or voltage on the power input line. The bias voltage inputs provide bias voltages for gate oxide overstress protection during normal (i.e., non-ESD) operation of the ESD circuit 100. Exemplary values for the bias voltage input signals are 3.6V for vcascp and 2.5V for vcascn. These input bias voltages are generally a function of the chip supply voltages vpwr2 and vpwr1. The trigger circuit 120 also includes two output lines, scasc and strig, which are coupled to the ESD shunt circuit 110 to provide control signals for the ESD shunt circuit 110. These two output control signals will be described in further detail below and with reference to FIGS. 5 and 6. The trigger circuit 120 is also coupled to a ground reference, vgnd_trig.

The illustrated ESD shunt circuit 110 includes a low voltage (LV) transistor 140 and a first high voltage (HV) transistor 150. In one embodiment, the first high voltage transistor 150 may be a native transistor. The low voltage transistor 140 is designated as M1a. The high voltage transistor 150 is designated as M1b. The low voltage transistor 140 and the first high voltage transistor 150 are arranged to form a transistor stack coupled between a power source, vpwr1, and a ground reference, vgnd_shunt. In one embodiment, the power source lines of the trigger circuit 120 and the ESD shunt circuit 110 are directly or indirectly coupled together so that an ESD event on either power source line may be detected by the trigger circuit 120.

In the depicted configuration, the low voltage transistor 140 acts as a switch to turn on the transistor stack. During normal operation, before and after an ESD event, the low voltage transistor 140 may be turned off to prevent current from passing between the power source and ground reference via the ESD shunt circuit 110. In one embodiment, the trigger circuit 120 supplies a bias voltage to the first high voltage transistor 150 to prevent overstress of the low voltage transistor 140 and the first high voltage transistor 150. An exemplary value of the bias voltage input signal to the first high voltage transistor 150 is 2.5V.

During an ESD event, the trigger circuit 120 may turn on the low voltage transistor 140 and the first high voltage transistor 150. Exemplary values for the voltage input signals to turn on the low voltage transistor 140 and the high voltage transistor 150 are 4.0V and 8.0V, respectively. The low voltage transistor 140 acts as a switch, as described above. The first high voltage transistor 150 acts as a resistive load to dissipate at least some of the electrical power resulting from the ESD event. In this manner, the ESD shunt circuit 110 may operate in conjunction with the trigger circuit 120 to divert an ESD current to ground without damaging any electrical components.

Although FIG. 2 depicts one embodiment of an ESD shunt circuit 110 having one low voltage transistor 140 and one high voltage transistor 150, other embodiments of the ESD shunt circuit 110 may include additional low voltage transistors 140, high voltage transistors 150, or both. Additionally, the trigger circuit 120 may have fewer or more output control lines to supply control signals to the ESD shunt circuit 110. Although FIG. 2 shows one control line for each transistor in the ESD shunt circuit 110, other embodiments may include fewer or more control lines than the number of transistors in the ESD shunt circuit 110.

Figure 3:
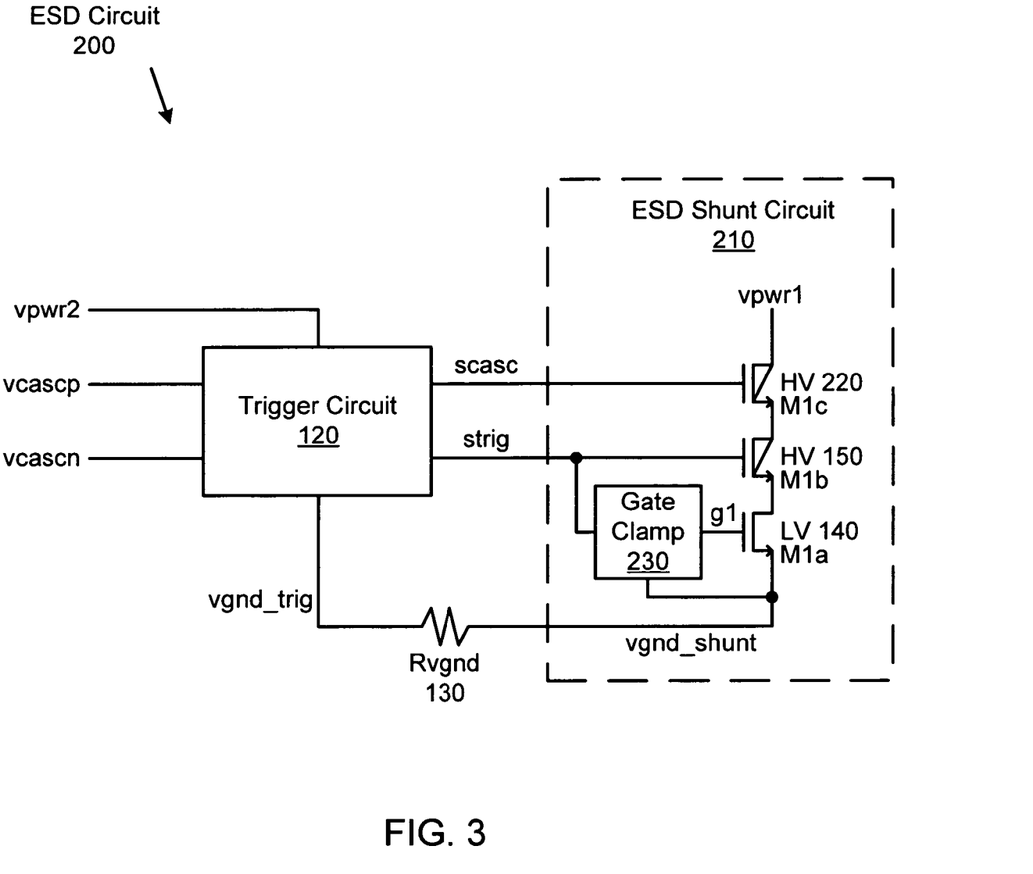
FIG. 3 depicts another embodiment of an ESD circuit having a modified ESD shunt circuit.

FIG. 3 depicts another embodiment of an ESD circuit 200 having a modified ESD shunt circuit 210. Although some similarities may exist between the ESD circuit 100 of FIG. 2 and the ESD circuit 200 of FIG. 3, the ESD shunt circuit 210 of FIG. 3 is different from the ESD shunt circuit of FIG. 2. In particular, the ESD shunt circuit 210 of FIG. 3 includes a second high voltage transistor 220, in addition to a first high voltage transistor 150 and a low voltage transistor 140. In one embodiment, the second high voltage transistor 220 may be a native transistor. The second high voltage transistor 220 is designated as M1c. The ESD shunt circuit 210 also includes a gate clamp circuit 230 coupled to one of the input control lines, strig, and to the ground reference, vgnd_shunt. One example of the gate clamp circuit is shown in and described in more detail with reference to FIG. 4. Although the ESD shunt circuit 210 includes the second high voltage transistor 220 and the gate clamp circuit 230, other embodiments of the ESD shunt circuit 210 may include the second high voltage transistor 220 and not the gate clamp circuit 230. Alternatively, another embodiment of the ESD shunt circuit 210 may include the gate clamp circuit 230 and not the second high voltage transistor 220.

In the depicted configuration, the low voltage transistor 140 acts as a switch to turn on the transistor stack. During normal operation, before and after an ESD event, the low voltage transistor 140 may be turned off to prevent current from passing between the power source and ground reference via the ESD shunt circuit 210. In one embodiment, the trigger circuit 120 supplies a bias voltage to the second high voltage transistor 220 to prevent overstress of the low voltage transistor 140, the first high voltage transistor 150, and the second high voltage transistor 220. An exemplary value of the bias voltage input signal to the second high voltage transistor 220 is 3.6V. In one embodiment, the first high voltage transistor 150 may be turned on or off during normal operation.

During an ESD event, the trigger circuit 120 may turn on the low voltage transistor 140, the first high voltage transistor 150, and the second high voltage transistor 220. Exemplary values for the voltage input signals to turn on the low voltage transistor 140, the first high voltage transistor 150, and the second high voltage transistor 220 are 4.0V, 8.0V, and 8.0V, respectively. The low voltage transistor 140 acts as a switch, as described above. The first high voltage transistor 150 acts as a resistive load to dissipate at least some of the electrical power resulting from the ESD event. The second high voltage transistor 220 also acts as a resistive load to dissipate the electrical power from the ESD event. In this manner, the ESD shunt circuit 210 may operate in conjunction with the trigger circuit 120 to divert an ESD current to ground without damaging any electrical components.

In the illustrated embodiment, the gate clamp circuit 230 receives a bias voltage input signal, strig, from the trigger circuit. The same bias voltage output line from the trigger circuit 120 is also coupled to the first high voltage transistor 150. However, the gate clamp circuit 230 provides a voltage-clamped control signal, g1, to the low voltage transistor 140, rather than the unclamped control signal, strig. An exemplary value of the clamped voltage control signal, g1, is 4.0V maximum during an ESD event. In another embodiment, the gate clamp circuit 230 may be coupled to an independent control signal output from the trigger circuit 120. Alternatively, the gate clamp circuit 230 may be coupled to another bias voltage input signal such as the bias voltage input signal, scasc.

Figure 4:
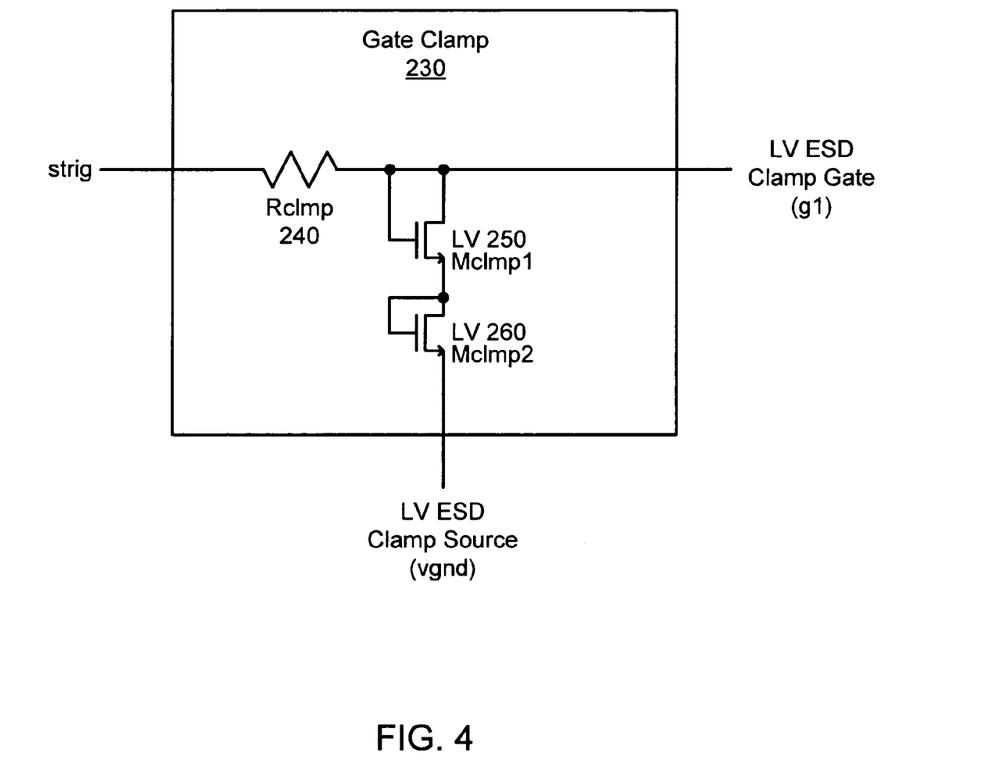
FIG. 4 depicts one embodiment of a gate clamp circuit.

FIG. 4 depicts one embodiment of a gate clamp circuit 230. The illustrated gate clamp circuit 230 includes an input line, an output line, and a ground reference line. In one embodiment, the input line is coupled to an output line, strig, from the trigger circuit 120, as shown in FIG. 3. In another embodiment, the input line of the gate clamp circuit 230 may be coupled to another control line of the ESD circuit 210. The output line of the gate clamp circuit 230 is coupled to the gate of the low voltage transistor 140 of the ESD shunt circuit 210. The ground reference line is coupled to a ground reference source of the ESD circuit 200.

In the depicted embodiment, the gate clamp 230 also includes a resistive load 240, a first low voltage clamping transistor 250, and a second low voltage clamping transistor 260. In one embodiment, the clamping transistors 250 and 260 are diode-connected n-channel transistors. The resistive load 240 is designated as Rclmp and coupled between the input and output lines of the gate clamp circuit 230. The first low voltage clamping transistor 250 is designated as Mclmp1. The second low voltage clamping transistor 260 is designated as Mclmp2. The clamping transistors 250 and 260 are coupled in a cascode stack arrangement between the output line and the ground reference line. In particular, the clamping transistors 250 and 260 are connected as diodes, with the gate of each clamping transistor 250 and 260 electrically connected to the drain of the corresponding clamping transistor 250 and 260. In the depicted configuration, the clamping transistors 250 and 260 function as a voltage divider so that the output signal, g1, is clamped at approximately twice the voltage drop of a single clamping transistor 250 or 260. An exemplary value of the clamped voltage on the output line of the gate clamp circuit 230 is 4.0V maximum during an ESD event.

Although a particular schematic design for the gate clamp circuit 230 is illustrated in FIG. 4, other embodiments of the ESD circuit 200 may utilize another type of gate clamp circuit 230. For example, the gate clamp circuit 230 may include fewer or more clamping transistors 250 and 260. In another embodiment, the gate clamp circuit 230 may be implemented with a diode-connected n-channel transistor instead of the resistive load 240. In another embodiment, the gate clamp circuit 230 may be implemented with resistors instead of the low voltage clamping transistors 250 and 260, although the resulting clamped voltage may be more dependent on the current through the gate clamp circuit 230. Other embodiments of the gate clamp circuit 230 also may be used to generate a clamped voltage on the output line.

Additionally, the ESD shunt circuit 210 may have other configurations. For example, the ESD shunt circuit 210 may have fewer or more transistors. In another embodiment, the high voltage transistors 150 and 220 and the low voltage transistor may be arranged in another order. In another embodiment, the transistors may be PMOS transistors, which may influence the arrangement of the low voltage transistor 140 in relation to the high voltage transistors 150 and 220, as well as the control signals from the trigger circuit 120. In other embodiments, the ESD circuit 200 may include an ESD shunt circuit 210 with other characteristics.

Figure 5:
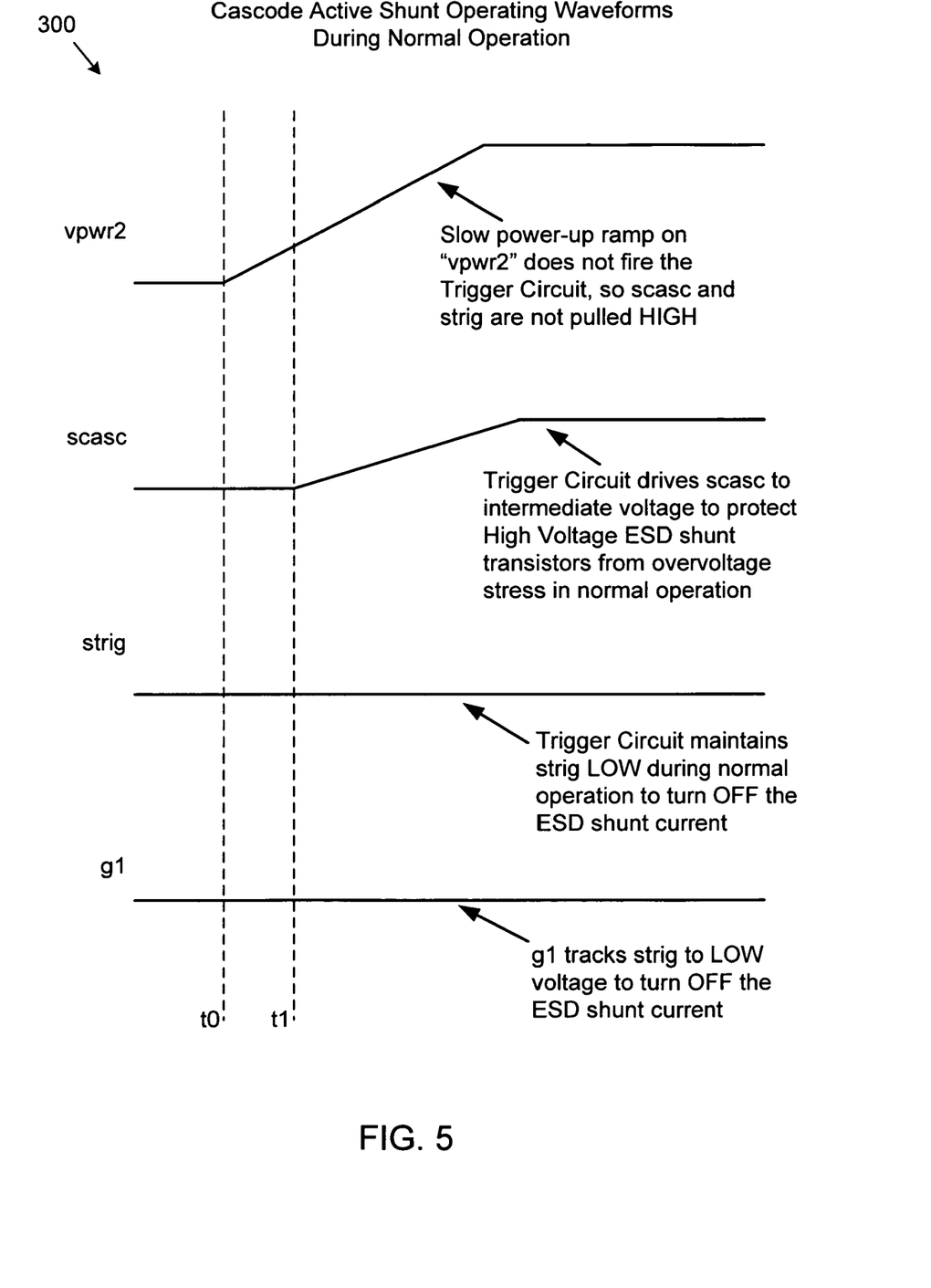
FIG. 5 depicts one embodiment of operating waveforms of an ESD circuit during normal operation.

FIG. 5 depicts one embodiment of operating waveforms 300 of an ESD circuit 200 during normal operation. In other words, the operating waveforms 300 of FIG. 5 correspond to a time other than during the occurrence of an ESD event. In particular, the operating waveforms 300 include the power signal, vpwr2, on the power source line, the output bias control signal, scasc, and the output control signal, strig, from the trigger circuit 120, and the clamped voltage signal, g1, from the gate clamp circuit 230. The trigger circuit 120 monitors the power source line to detect the power signal. During normal operation, the power signal does not change rapidly, so the trigger circuit 120 detects a slow power-up ramp on the power source line at time t0.

In one embodiment, the trigger circuit 120 is configured to generate a bias control signal on one of the output control lines during normal operation. For example, the trigger circuit 120 may generate the bias control signal at a time t1 in response to the slow power-up ramp on the power source coupled to the trigger circuit 120. Driving the bias control signal on the output line coupled to the second high voltage transistor 220 protects the stacked transistors 140, 150, and 220 from overvoltage stress during normal operation. In the absence of the bias control signal, the second high voltage transistor 220 will continue to see increasing potential difference across its gate oxide between the gate and drain terminals resulting in gate oxide overstress that can lead to damage of the gate oxide. The bias control signal helps to minimize the potential difference across the gate oxide thereby protecting the second high voltage transistor 220. The bias control signal also acts to limit the voltage on the source of second high voltage transistor 220, which is coupled to the drain of the first high voltage transistor 150. This limits the maximum voltage between the gate and drain terminals of the first high voltage transistor 150, thereby limiting its gate oxide stress and protecting the first high voltage transistor 150 from damage during normal operation. The trigger circuit 120 is configured to maintain the other control signal low during normal operation so that the resulting gate clamp signal is also low during normal operation. This turns off the ESD shunt circuit 210 so that current passes between the power source and ground via the ESD shunt circuit during normal operation.

Figure 6:
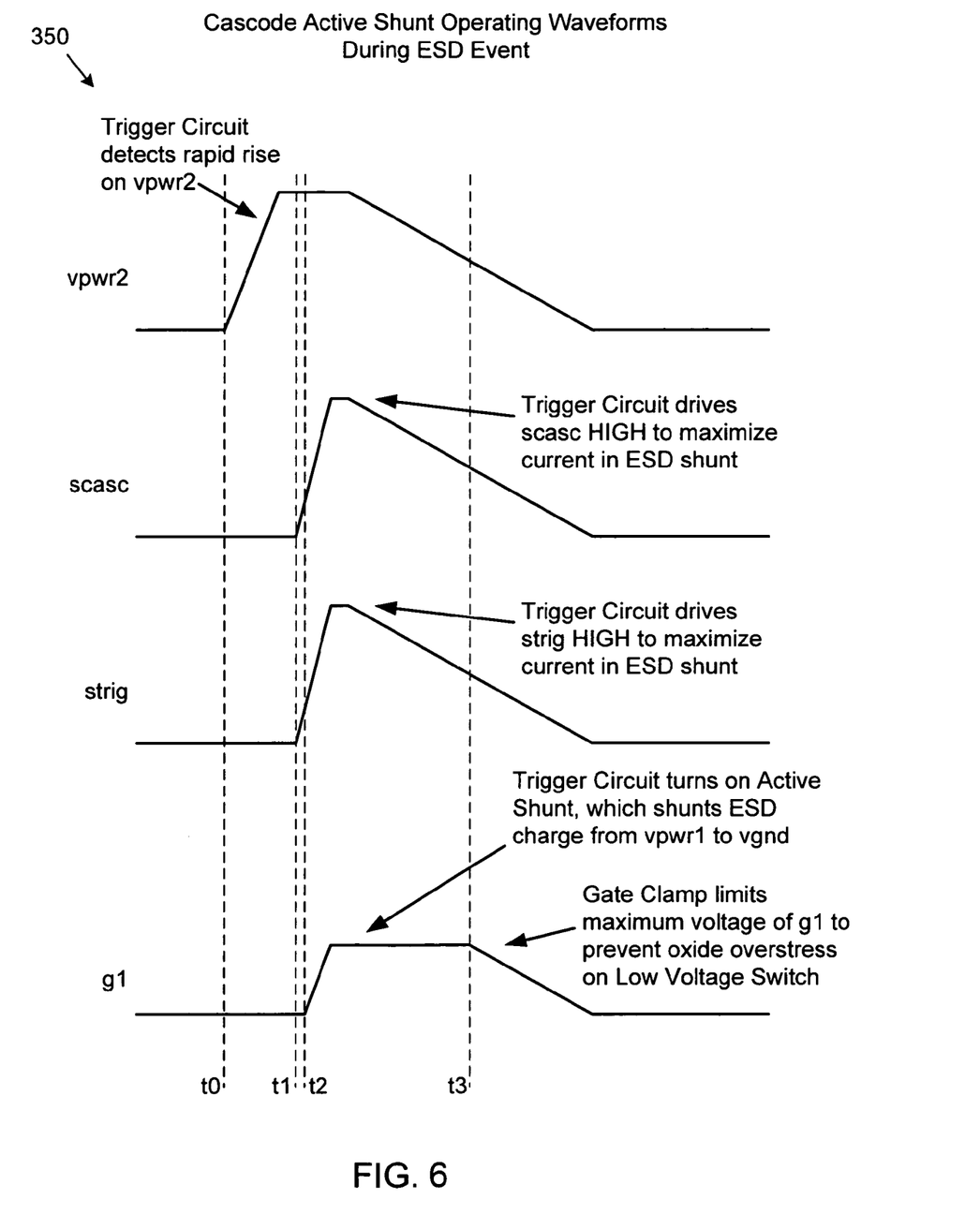
FIG. 6 depicts one embodiment of operating waveforms of an ESD circuit during an ESD event.

FIG. 6 depicts one embodiment of operating waveforms 350 of an ESD circuit 200 during an ESD event. In particular, the operating waveforms 350 correspond to the same signals shown in FIG. 5, including the power signal, vpwr2, on the power source line, the output bias control signal, scasc, and the output control signal, strig, from the trigger circuit 120, and the clamped voltage signal, g1, from the gate clamp circuit 230. To detect the occurrence of an ESD event, the trigger circuit 120 monitors the power source line to detect the power signal. When an ESD event occurs, the trigger circuit 120 detects a rapid rise in the power signal. The beginning of the ESD event is designated as time t0.

Upon recognizing an ESD event, the trigger circuit 120 turns on the first and second high voltage transistors 150 and 220 at a time designated as time t1. In one embodiment, the trigger circuit generates and transmits a high pulse on the control lines coupled to the ESD shunt circuit 110. For example, the trigger circuit 110 may output pulses having an amplitude approximately equal to the voltage on the power source, vpwr2. Nearly simultaneously, the trigger circuit 120 turns on the low voltage transistor 140 at a time designated as time t2. In one embodiment, the trigger circuit 120 turns on the low voltage transistor 140 as a result of sending the high pulse on one of the control lines to which the gate clamp circuit 230 is coupled. In one embodiment, the time delay between times t1 and t2 is only due to the transmission delay of the gate clamp circuit 230. Alternatively, the time delay between times t1 and t2 may be controlled by the trigger circuit 120 or another component in the ESD circuit 200.

The gate clamp circuit 230 clamps the control voltage signal from the trigger circuit 120 to the low voltage transistor 140. Clamping the control signal in this manner protects the low voltage transistor 140 from overstress that might result from using an unclamped control voltage. Between the times designated as t2 and t3, the ESD shunt circuit 210 is active and shunts the potentially harmful ESD charge to the ground reference. Exemplary times between t0, t1, t2, and t3 are 6 ns, 200 ps, 100 ns, respectively. However, the actual times may deviate depending on the actual characteristics of the ESD event and the ESD circuit 200.

Figure 7:
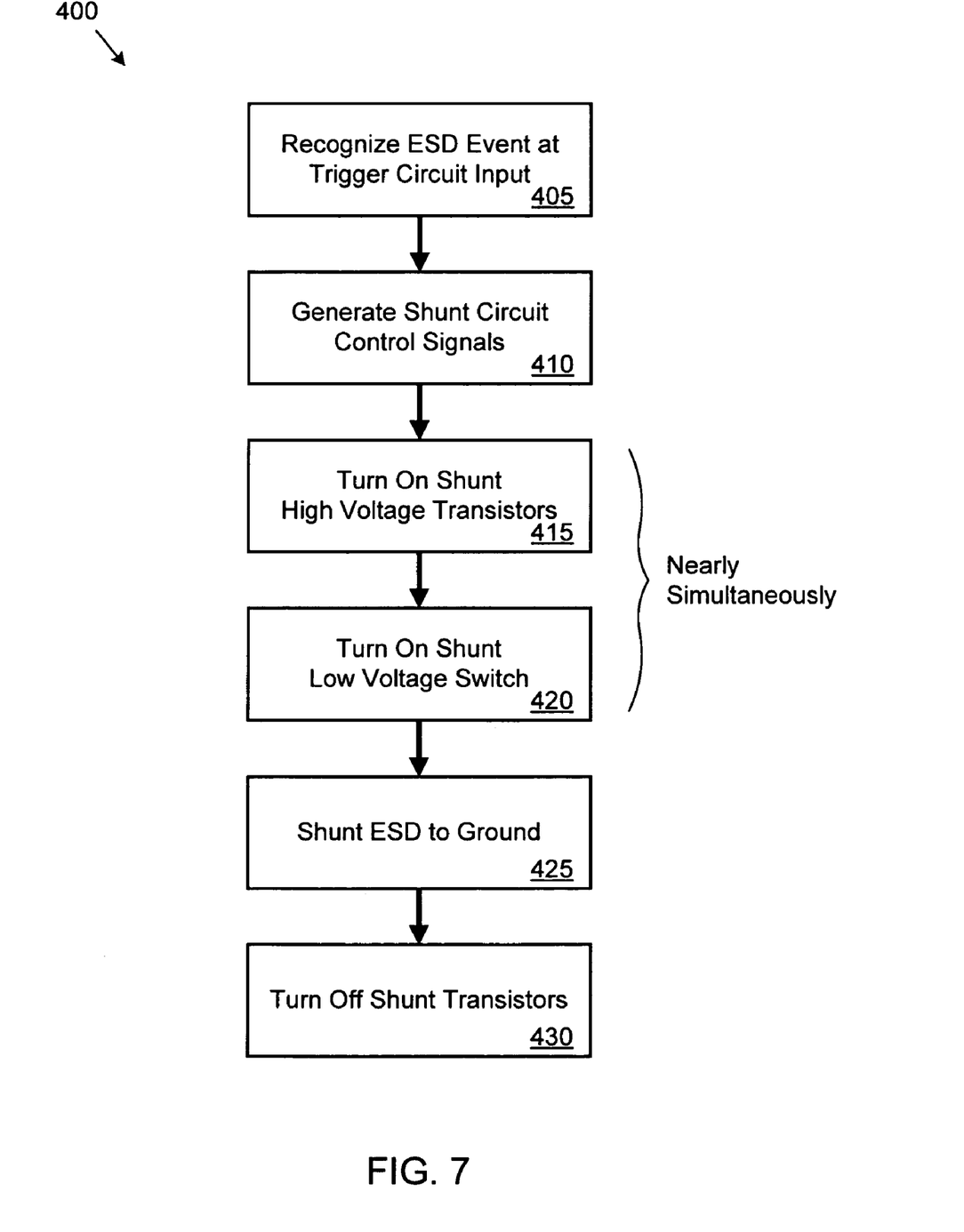
FIG. 7 depicts one embodiment of an ESD shunt method.

FIG. 7 depicts one embodiment of an ESD shunt method 400. The illustrated ESD shunt method 400 functionally shows the operations of the ESD circuit 200 during the approximate time of an ESD event. In particular, the ESD shunt method 400 begins when the trigger circuit 120 recognizes 405 an ESD event. The trigger circuit 120 then generates 410 the control signals, scasc and strig, for the ESD shunt circuit 210. By transmitting the control signals to the ESD shunt circuit 210, the control signals turn on 415 the high voltage transistors 150 and 220 and, nearly simultaneously, turn on 420 the low voltage transistor 140. As described above, the low voltage transistor 140 acts as a switch to turn on the ESD shunt circuit 210 in order to shunt 425 the ESD current and voltage to ground. The trigger circuit 120 then turns off 430 the ESD shunt circuit 210 so that the power source is no longer connected to ground.

Figure 8:
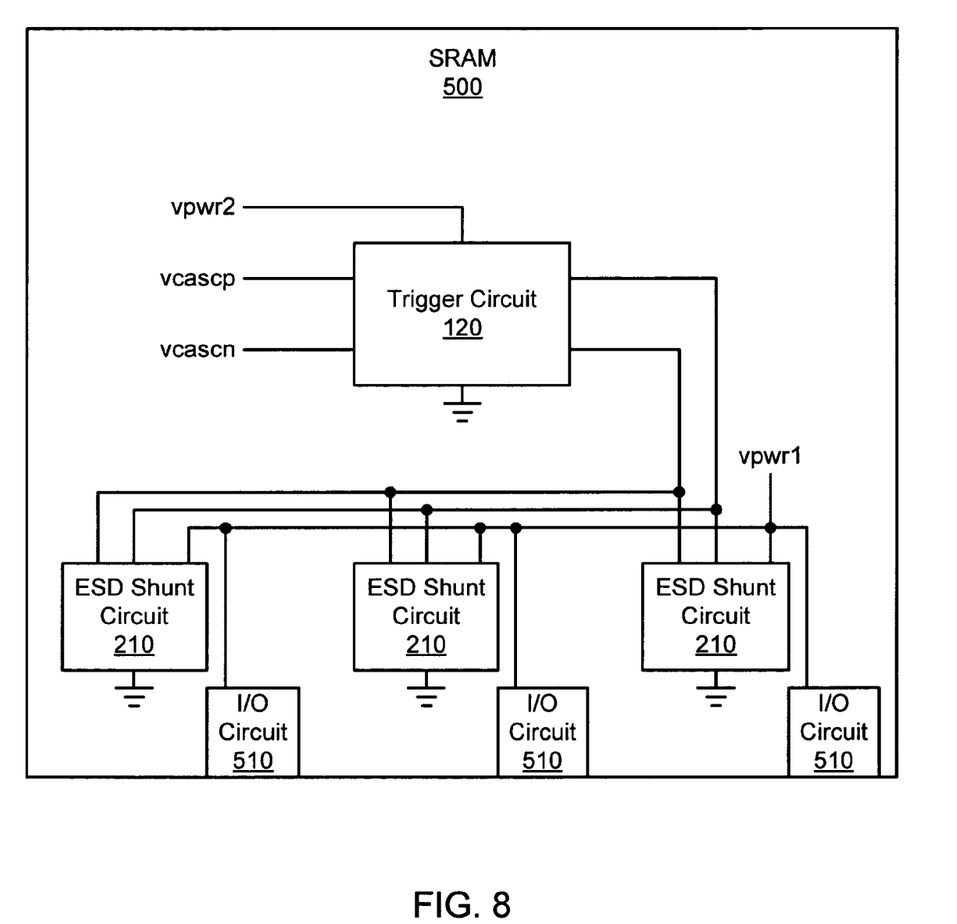
FIG. 8 depicts one embodiment of a static random access memory (SRAM) with a global trigger circuit and a plurality of local ESD shunt circuits.

FIG. 8 depicts one embodiment of a static random access memory (SRAM) 500 with a global trigger circuit 120 and a plurality of local ESD shunt circuits 210. For clarity and convenience, the schematic illustration of the SRAM 500 omits many typical features and components of a memory device. Nevertheless, the depicted SRAM 500 portrays how an ESD circuit 200 may be used to protect the input/output (I/O) circuits 510 of the SRAM 500. In a similar manner, an ESD circuit may be used to protect other components of the SRAM 500 or another electronic device.

In one embodiment, each of the ESD shunt circuits 210 is located relatively close to one of the I/O circuits 510 in order to protect the SRAM 500 from an ESD event that occurs at the I/O circuits 510. In many instances, an ESD event may occur remotely from the SRAM 500, but may arrive at the I/O circuits 510 in route to the internal components of the SRAM 500. In another embodiment, the ESD event may originate within the SRAM 500. In any case, multiple ESD shunt circuits 210 may be distributed throughout the SRAM 500, or another electronic device, at locations where an ESD event is likely to originate with respect to that device. In this way, the each of the ESD shunt circuits 210 may be locally positioned next to or near a particular component within the SRAM 500.

The trigger circuit 120, on the other hand, is shown as a global trigger circuit. In particular, a single trigger circuit 120 supplies control signals to all of the ESD shunt circuits 210. Alternatively, the SRAM 500 may include multiple trigger circuits 120 so that the ratio of trigger circuits 120 to ESD shunt circuits 210 may be approximately 1:10, 1:4, 1:1, or another ratio. In another embodiment, the ESD circuit 200 may have a global gate clamp circuit 230, rather than individual gate clamp circuits 230 for each ESD shunt circuit 210. For example, a global gate clamp circuit 230 may be included in the global trigger circuit 120. In another embodiment, the global gate clamp circuit 230 may be separate from the global trigger circuit 120 or there may be multiple regional gate clamp circuits 230 distributed within the SRAM.

Certain embodiments of the method, apparatus, and system described above offer advantages, compared to conventional technologies. One advantage of having a combination of low voltage and high voltage transistors is the ability to have some transistors with zero or negative threshold voltages and some transistors with positive threshold voltages. For example, the high voltage transistors 150 and 220 may have nominally zero threshold voltages, and the low voltage transistor 140 may have a positive threshold voltage. However, other combinations of threshold voltages may be implemented.

One advantage of using multiple transistors in a cascode arrangement is the ability to operate at voltages higher than the operating capacity of any one transistor alone. In one embodiment, using appropriate bias voltages for the control signals, scasc and strig, facilitates protection of the transistors 140, 150, and 220 against gate oxide overstress at the higher voltages.

Although the operations of the method(s) herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. A system, comprising:
an electrostatic discharge (ESD) shunt circuit comprising:
a first high voltage transistor coupled to a power source, and
a second high voltage transistor coupled to the first high voltage transistor;
a low voltage transistor coupled to the second high voltage transistor and to a ground source; and
a trigger circuit having a first trigger output coupled to the first high voltage transistor and a second trigger output coupled to the second high voltage transistor and to the low voltage transistor, wherein the trigger circuit is configured to sense an ESD event and generate a first trigger signal at the first trigger output and a second trigger signal at the second trigger output, in response to the ESD event, and wherein the first high voltage transistor, the second high voltage transistor and the low voltage transistor are coupled in a cascode arrangement.

2. The system of claim 1, wherein the first trigger signal to turn on the first high voltage transistor in response to the ESD event.

3. The system of claim 2, wherein the second trigger signal to turn on the low voltage transistor in response to the ESD event.

4. The system of claim 3, wherein the trigger circuit is further configured to supply a reference signal to the low voltage transistor during normal operation to turn off the low voltage transistor.

5. The system of claim 2, wherein the trigger circuit is further configured to supply a bias signal to the first high voltage transistor during normal operation to protect the first high voltage transistor from overstress.

6. The system of claim 1, further comprising a second high voltage transistor, wherein the second high voltage transistor is coupled between the first high voltage transistor and the power source.

7. The system of claim 1, wherein the system further comprises a memory circuit having an input/output (I/O) pad, wherein the ESD shunt circuit is locally coupled to the I/O pad of the memory circuit.

8. The system of claim 7, wherein the trigger circuit is coupled to the memory circuit.

9. The system of claim 8, further comprising at least one additional ESD shunt circuit locally coupled to at least one corresponding additional I/O pad, wherein the trigger circuit is a global trigger circuit coupled to each of the ESD shunt circuits to supply the at least one trigger signal to each of the ESD shunt circuits.

10. A method, comprising:
recognizing an electrostatic discharge (ESD) current associated with an ESD event;
turning on a first high voltage transistor of an ESD shunt circuit in response to the ESD event, wherein turning on the first high voltage transistor comprises generating a first trigger signal at a first trigger output of a trigger circuit and supplying the first trigger signal to the first high voltage transistor; and
turning on a second high voltage transistor coupled to the first high voltage transistor and a low voltage transistor coupled to the second high voltage transistor to shunt the ESD current to ground, wherein turning on the second high voltage transistor and the low voltage transistor comprises generating a second trigger signal at a second trigger output of the trigger circuit and supplying the second trigger signal to the second high voltage transistor and to the low voltage transistor, and wherein the first high voltage transistor, the second high voltage transistor and the low voltage transistor are coupled in a cascode arrangement.

11. The method of claim 10, further comprising turning off the low voltage transistor before and after shunting the ESD current to ground.

12. The method of claim 10, further comprising biasing the first high voltage transistor before and after the ESD event.

13. The method of claim 10, further comprising supplying a first control voltage to the low voltage transistor.

14. The method of claim 13, further comprising supplying a second control voltage to the first high voltage transistor.

15. An apparatus, comprising:
means for shunting an electrostatic discharge (ESD) current to a ground source during an ESD event; and
means for switching the shunting means using a low voltage transistor, a first high voltage transistor and a second high voltage transistor; and
means for providing a first trigger signal generated at a first trigger output of a trigger circuit to the first high voltage transistor and a second trigger signal generated at a second trigger output of the trigger circuit to the second high voltage transistor and to the low voltage transistor, and wherein the first high voltage transistor, the second high voltage transistor and the low voltage transistor are coupled in a cascode arrangement.

16. The apparatus of claim 15, further comprising means for limiting gate oxide stress of the first high voltage transistor of an ESD shunt circuit during an operating time other than during the ESD event.

17. The apparatus of claim 15, further comprising means for limiting gate oxide stress of the low voltage transistor during the ESD event.

18. The apparatus of claim 15, further comprising means for providing separate control signals to the low voltage transistor and the first high voltage transistor.

19. The system of claim 6, further comprising a gate clamp circuit, wherein the gate clamp circuit is coupled to the second trigger output, the ground source and a gate terminal of the low voltage transistor.

20. The system of claim 19, wherein the gate clamp circuit comprises a resistive load, a first low voltage clamping transistor and a second low voltage clamping transistor, wherein the first low voltage clamping transistor and the second low voltage clamping transistor are coupled in a cascade arrangement and wherein a gate terminal of each low voltage clamping transistor is coupled to a drain terminal of each low voltage clamping transistor.

\* \* \* \* \*